(12) United States Patent
Reiser

(10) Patent No.: US 6,319,648 B1
(45) Date of Patent: Nov. 20, 2001

(54) DISSOLUTION INHIBITION RESISTS FOR MICROLITHOGRAPHY

(75) Inventor: Arnost Reiser, Brooklyn, NY (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/462,963

(22) PCT Filed: Jul. 14, 1998

(86) PCT No.: PCT/US98/14510

§ 371 Date: Jan. 14, 1998

§ 102(e) Date: Jan. 14, 1998

(87) PCT Pub. No.: WO99/04319

PCT Pub. Date: Jan. 28, 1999

Related U.S. Application Data

(60) Provisional application No. 60/052,532, filed on Jul. 15, 1997.

(51) Int. Cl.[7] ............... G03F 7/023; G03F 7/039
(52) U.S. Cl. ............ 430/170; 430/192; 430/270.1; 430/905
(58) Field of Search ............... 430/270.1, 192, 430/170

(56) References Cited

U.S. PATENT DOCUMENTS

| | | | |
|---|---|---|---|
| 4,439,516 | 3/1984 | Cernigliaro et al. | 430/323 |
| 4,678,737 | 7/1987 | Schneller et al. | 430/270.1 |
| 4,842,983 | 6/1989 | Hasegawa | 430/175 |
| 4,868,256 | 9/1989 | Aslam et al. | 526/725 |
| 5,079,129 | 1/1992 | Roth et al. | 430/280.1 |
| 5,081,000 | 1/1992 | Kuehn et al. | 430/281.1 |
| 5,084,522 | 1/1992 | Frechet | 525/333.4 |
| 5,128,232 | 7/1992 | Thackeray et al. | 430/192 |
| 5,266,440 | 11/1993 | Zampini | 430/192 |
| 5,384,229 | 1/1995 | Pai et al. | 430/270.1 |
| 5,492,793 | 2/1996 | Breyta et al. | 430/270.14 |
| 5,541,263 * | 7/1996 | Thackeray et al. | 525/328.8 |
| 5,629,135 | 5/1997 | Kobayashi et al. | 430/270.1 |
| 5,824,451 * | 10/1998 | Aoai et al. | 430/270.1 |
| 5,853,953 * | 12/1998 | Georger, Jr. | 430/270.1 |
| 5,985,512 * | 11/1999 | Hatakeyama et al. | 430/270.1 |
| 6,013,411 * | 1/2000 | Aoai et al. | 430/270.1 |
| 6,033,826 * | 3/2000 | Urano et al. | 430/270.1 |
| 6,106,993 * | 8/2000 | Watanabe et al. | 430/270.1 |

FOREIGN PATENT DOCUMENTS

| | | |
|---|---|---|
| 0190799 | 8/1986 | (EP) . |
| 0227487 | 7/1987 | (EP) . |
| 0307752 | 3/1989 | (EP) . |
| 60-17739 | 1/1960 | (JP) . |
| 8-337616 | 12/1996 | (JP) . |

OTHER PUBLICATIONS

Przybilla, K. et al., Progress in DUV Resins, Advances in Resist Technology andProcessing VIII, 1991, 174–187, vol. 1466, SPIE.

Roschert, H. et al., DN 21, DN 41: Negative Tone Photoresists for Deep–UV Lithography, Advances in Resist Technology and Processing IX, 1992, 157–171, vol. 1672, SPIE.

Yeh, T. F. et al., A scaling Law For the Dissolution of Phenolic Resins in Aqueous Base, 1993, 570–581, vol. 1925, SPIE.

Dammel, R. R. et al., Lithographic Performance of Isomeric Hydroxystyrene Polymers, Advances in Resist Technology XI, 1994, 542–558, 2195, SPIE.

Leeson, Michael J. et al., Tailoring of A Photoactive Compound for Non–Chemically Amplified 248nm Resist Formulations, 1997 861–870, vol. 3049, SPIE.

Patent Abstract, JP 05204149–A, Jan. 28, 1992, Fuji Photo Film Co Ltd.

Patent Abstract, JP 05107763–A, Oct. 17, 1991, Japan Synthetic Rubber Co Ltd.

Mar., pp. 278–280; "Advanced Organic Chemistry Reactions, Mechanisms, and Structure" Fourth Edition, John Wiley and Sons, Inc., New York (1992).

* cited by examiner

*Primary Examiner*—John S. Chu

(57) ABSTRACT

Improved dissolution inhibition resists for use in microlithography are disclosed herein. These resists are comprised of phenolic base resin(s) having increased inhibitability and which are suitable for use in resist formulations for microlithography and semiconductor applications.

8 Claims, 4 Drawing Sheets

△ NOVOLAK, f=10.8
○ 5% NITRATION OF PVP, f=10.1

DISSOLUTION INHIBITION RESISTS FOR MICROLITHOGRAPHY

This application is a 371 of PCT/US98/14510 filed Jul. 14, 1998 which claims benefit of Prov. No. 60/052,532 filed Jul. 15, 1997.

BACKGROUND OF THE INVENTION

1. Field of the Invention

The present invention relates to the field of photoimaging, and in particular to the base resins of dissolution inhibition resists which are the most common imaging material of the semiconductor device industry.

2. Description of Related Art

Dissolution inhibition resists, particularly those based on novolak resins, are currently widely employed for imaging semiconductor devices using ultraviolet (UV) light These resists comprise 1) a base resin and 2) a photoactive component (PAC), the latter of which is also termed an inhibiting additive when present in this type of resist The base resin is typically a phenolic resin, and the photoactive component is typically a diazonaphthoquinone. Dissolution inhibition resists are known to the art. See, for example, *Photoreactive Polymers, The Science and Technology of Resists*, Chapter 5, by Amost Reiser, Wiley-Interscience, John Wiley & Sons, New York (1989).

Such typical dissolution inhibition photoresists are based on two phenomena: the inhibition by diazdnaphthoquinones of the dissolution of phenolic resins in aqueous alkali, and the photochemical transformation of the diazonaphthoquinones into indene carboxylic acids.

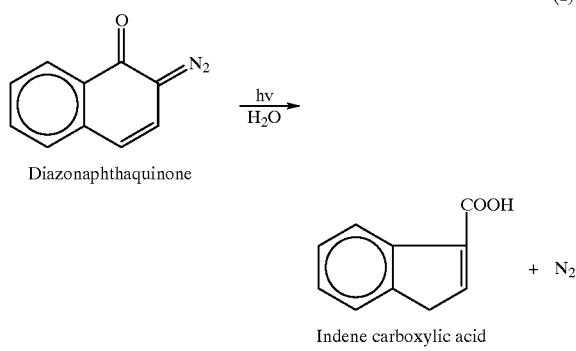

Diazonaphthaquinone

Indene carboxylic acid (1)

The phenolic resin is usually, but not always, a phenol-formaldehyde polycondensate of low molecular weight known as a novolac. On their own, these resins are readily soluble in dilute aqueous alkali, but when a suitable diazoquinone derivative is added, their rate of dissolution is greatly reduced. Nonionizable hydrophobic diazoquinone acts here as a dissolution inhibitor. On irradiation, the diazoquinone transforms into an acid that is soluble in aqueous alkali and which is no longer a dissolution inhibitor and may even promote the dissolution of the resin. In practice, a mixture of novolac and, say, 15% of a diazonaphthoquinone is coated as a thin film on a substrate, for example a silicon wafer, the film is exposed to a radiation pattern and subsequently treated with dilute alkali. The exposed areas of the resist dissolve much faster than the unexposed ones; if the process is stopped in time, a patterned resist film remains in the unirradiated areas. Such material functions as a positive photoresist.

The lithographic contrast achievable with dissolution inhibition resists depends not only on the inhibiting additive (the photoactive component or PAC), but also on the phenolic base resin in which the PAC is dispersed. The fundamental property of a resin which renders it suitable for use in microlithography is the ability of the resin to have its dissolution in aqueous base inhibited by the addition of various diazonaphthoquinones (DNQ) or other active additives. This property is commonly referred to as its "inhibitability." It is this property which determines the image contrast of the resist made from a particular base resin. Image contrast and resin inhibitability are thus intimately linked.

JP 8 337 616 A discloses a chemically-amplified positive working photoresist composition and does not disclose compositions or related topics for dissolution inhibition photoresists apart from certain dissolution control agents being disclosed as optional additives in these chemically-amplified systems. Such modified chemically-amplified systems, even though they may contain dissolution control agents, are very distinct and different from dissolution inhibition photoresists. EP 0 227 487 A discloses a positive-working radiation-sensitive resin composition comprised of a 1,2-quinonediazide and an alkali soluble novolac resin produced from condensation of two types of phenolic compounds. This document does not disclose photoresists comprised of poly(vinyl phenols), the subject of the present invention. JP-A60 017 739 discloses a negative-working photoresist comprised of hydroxy-styrene polymer and a photosensitive azide compound. Since this document discloses negative photoresists, it is not particularly relevant to the positive-working photoresists of the present invention. EP 0190799 A discloses the use of a photosensitive dissolution inhibitor with a binder such as poly(2,4-dihydroxystyrene) in a positive-working photoresist. This exemplified binder (poly(2,4-dihydroxystyrene)) in this disclosure does not possess vicinal hydroxyl substitution and thereby teaches away from the present invention.

Poly(hydroxystyrene) resins [(poly(vinyl phenol) resins] have heretofore not been generally used extensively in microlithography applications primarily because of their low inhibitability. Therefore, there exists a need in the art for improved poly(hydroxystyrene) and other resins with increased inhibitability.

SUMMARY OF THE INVENTION

A first embodiment of the present invention is a positive-working photoresist composition comprising:

(a) a polymer comprising (amorap(,mei ulit A having the structure:

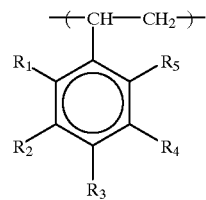

wherein $R_1$, $R_2$, $R_3$, $R_4$, and $R_5$ can be the same or different and are selected from the group consisting of H, OH, and X;

at least one of $R_1$, $R_2$, $R_3$, $R_4$, and $R_5$ being OH; and at least one of $R_1$, $R_2$, $R_3$, $R_4$, and $R_5$ being X; and X is selected from the group of substituents having a Hammett Substituent Constant ($\sigma$) in its position in relation to said at least one OH that is greater than or equal to 0.45, except that X is not a nitro (—$NO_2$) or a sulfonic acid ($SO_3H$) substituent; and (b) at least one photoactive component capable of making the photoresist composition be positive-working.

A second embodiment of the present invention is a positive-working photoresist composition comprising:

(a) a polymer comprising comonomer unit B having the structure:

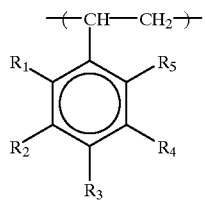

wherein $R_1$, $R_2$, $R_3$, $R_4$, and $R_5$ can be the same or different and are selected from the group consisting of H and OH;

at least two of $R_1$, $R_2$, $R_3$, $R_4$, and $R_5$ being OH in a vicinal arrangement where the at least two OH groups are attached to adjacent carbon atoms; and (b) at least one photoactive component capable of making the photoresist composition be positive-working, said photoactive component being a dissolution inhibitor.

A third embodiment of the present invention is a positive-working photoresist composition comprising:

(a) a polymer comprising comonomer unit C having the structure:

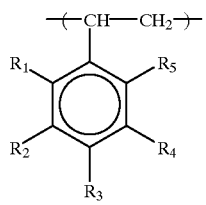

wherein $R_1$, $R_2$, $R_3$, $R_4$, and $R_5$ can be the same or different and are selected from the group consisting of H, OH, and X;

at least two of $R_1$, $R_2$, $R_3$, $R_4$, and $R_5$ being OH in a vicinal arrangement where the at least two OH groups are attached to adjacent carbon atoms; and X is selected from the group of substituents having a Hammett Substituent Constant (σ) in its position in relation to said at least one OH that is greater than or equal to 0.45, except that X is not a nitro (—$NO_2$) or a sulfonic acid ($SO_3H$) substituent; and (b) at least one photoactive component capable of making the photoresist composition be positive-working, said photoactive component being a dissolution inhibitor.

A fourth embodiment of the present invention is a positive-working photoresist composition comprising:

(a) a novolak. resin comprising a repeat unit D having the structure:

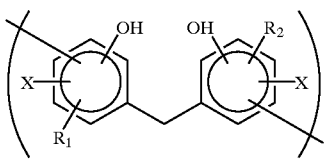

wherein X is selected from the group of substituents having a Hammett Substituent Constant (σ) in its position in relation to said at least one OH that is greater than or equal to 0.45, except that X is not a nitro (—$NO_2$) or a sulfonic acid ($SO_3H$) substituent, $R_1$ and $R_2$ are independently $C_1$–$C_6$ alkyl; and (b) at least one photoactive component capable of making the photoresist composition be positive-working.

The nitro (—$NO_2$) substituent is specifically excluded in all embodiments of this invention because of its known strong absorption characteristics in the deep UV region. If a resin having substantial amounts of the nitro substituent were present in the compositions of this invention, one would expect that the resist compositions would have significantly reduced photospeeds and perhaps other undesirable characteristics.

The sulfonic acid (—$SO_3H$) substituent is also specifically excluded in all embodiments of this invention because of its known high acidity, which would be expected to have a deleterious effect upon the resist compositions of this invention.

While the nitro substituent is specifically excluded from all embodiments of this invention for the reasons given supra, it is nevertheless utilized in some of the examples to demonstrate that resins containing an electron-withdrawing group, such as nitro, do indeed have increased inhibitability relative to comparable resins not having an electron-withdrawing group (e.g., unsubstituted PVP resin or unsubstituted Novolak resin).

BRIEF DESCRIPTION OF THE DRAWINGS

FIG. 4 is a plot of the logarithm of the dissolution rate (logR) versus the concentration ($C_a$) of the dissolution accelerator for two different dihydroxy compounds. $C_a$ is expressed in weight %.

Figure 1:
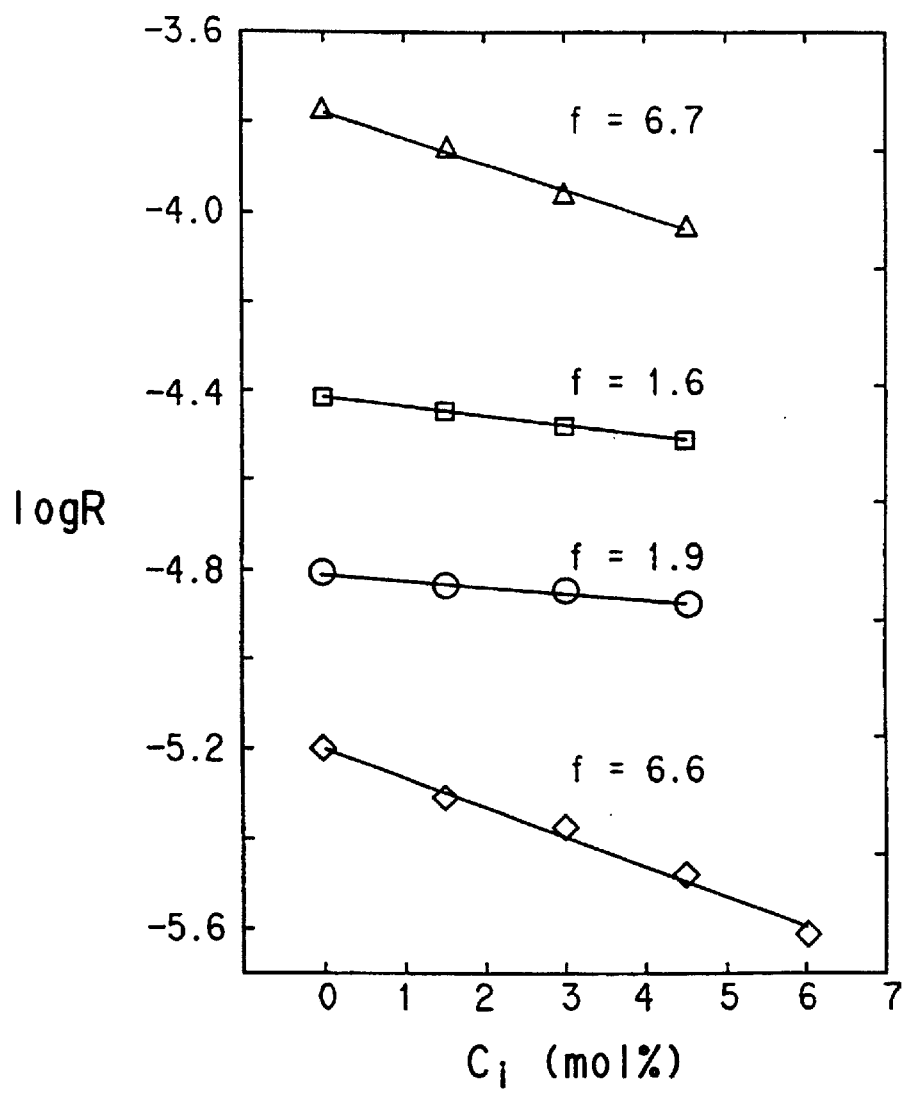
FIG. 1 is a plot of the logarithm of the dissolution rate (logR) versus the concentration ($C_i$) of the dissolution inhibitor for four different resins. The plots are essentially linear and the absolute value of the negative slope of a given plot is the inhibition factor f for a given resin in a series of test compositions. The four different resins whose test composition plots are in FIG. 1 are PVP, Polymer K, Polymer F, and Polymer G.

(The unit of R, the dissolution rate, in all the plots is nanometer/second (nm/sec).

DETAILED DESCRIPTION OF THE INVENTION

The inhibitability of resins can be increased by either increasing the amount of phenolic interactions (e.g., interactions between phenolic hydroxyl groups) or through substitution of the phenolic group with an electron-withdrawing substituent.

The inhibitability of a phenolic resin can be increased by substitution on at least a portion of the aromatic rings of the phenolic moieties at least one pair of hydroxy substituents in a vicinal arrangement.

The inhibitability of a phenolic resin can also be increased by substitution on the aromatic ring of the phenols with electron-withdrawing moieties. The most important application of this principle would be to poly(hydroxystyrene) (PHOST) resins. These resins, also referred to as poly (vinyl phenol) or (PVP) resins, are, in general, not suitable for microlithography because they are not easily inhibited by PACs. It is suspected that the reason for this is the low degree of interaction between the phenolic groups of the resin. Substitution with electron-withdrawing substituents, such as $NO_2$, CN, and $CF_3$ increases the inhibitability of the resin.

It is, therefore, an object of this invention to provide poly(hydroxystyrene) and other resins with increased inhibitability.

This and other objects of the invention are provided by novel resins with increased inhibitability as a result of: (1) an increased amount of phenolic interactions through structural modifications of the resin (e.g., poly(hydroxystyrene) or novolak having vicinal hydroxyl substituents on phenolic moieties); or (2) substitution on the phenolic group of the resin (e.g., poly(hydroxystyrene) or novolak) with one or more electron-withdrawing substituents.

First Embodiment

Specifically, the compounds of the first embodiment of the present invention are poly(hydroxystyrene) resins of various molecular weights that are substituted with a substituent X having a positive Hammett Substituent Constant that is greater than or equal to +0.45. With respect to the at least one hydroxyl group (—OH), the substituent X can be located ortho, meta, or para. It is preferred though that the substituent X be located either in the position para- to the OH group, in the meta-position, or in both meta-positions with respect to the OH group. These preferred arrangements are indicated below:

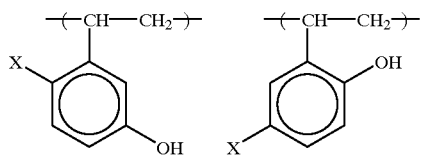

-continued

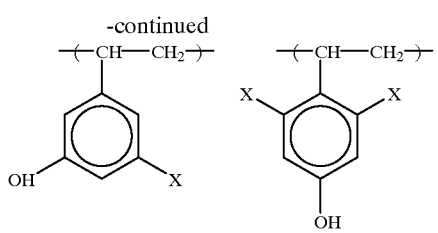

Suitable substituents for this invention are generally defined as those having a positive Hammett Substituent Constant $\geq 0.45$. A positive Hammett SubstituentConstant indicates that the substituent is electron-withdrawing at that position, while a negative constant would denote an electron-donating group. Apart from other considerations (vide infra), it is best according to this invention to select X having as large a Hammett Substituent Constant as possible, such that the inventive resins will have high inhabitabilities. The larger the constant, the more electron-withdrawing the substituent is and, generally, the larger is the level of inhibitability in the resulting inventive resin according to the invention. This is the case with various substituents, including, but not limited to, $NO_2$, $CF_3$, and CN.

Broadly, the substituent X can be any substituent having a positive Hammett Substituent Constant $\geq 0.45$. Suitable substituents X include, but are not limited to $C_1$–$C_6$ perfluoroalkyl (including $CF_3$); $C_1$–$C_6$-trialkylammonium, where each alkyl is independently $C_1$–$C_6$; cyano (CN), methyl sulfonyl ($SO_2CH_3$), and trifluoromethyl sulfonyl ($SO_2CF_3$). In the inventive resins, the substituent X can be located on a given aromatic ring with respect to the at least one OH group in an ortho, a meta, or a para position. Preferred substituents X, include, but are not limited CN, $CF_3$, $SO_2CH_3$, and $SO_2CF_3$, and the substituent X is substituted on a given aromatic ring with respect to the at least one OH group in a meta or a para position.

The Hammett Substituent Constants for a wide variety of substituents at given positions are generally known or available to those of skill in the art. See, for example, Advanced Organic Chemistry, Reactions, Mechanisms, and Structure, Fourth Edition, by Jerry March, John Wiley & Sons, Inc., 1992, pages 278–286, which is incorporated by reference.

Poly(hydroxystyrene) substituted in this manner, may be used as a base resin for microlithography. The invention is not limited to polyhydroxystyrene) resins, and the principle of substitution with electron-withdrawing substituents can be applied equally to other phenolic resins, such as novolak resins (see Embodiment 4 infra).

One skilled in the art would realize that steric considerations must normally be balanced with the substituent effect in the resins of this invention. For example, while it is more advantageous front a steric point of view to consider meta-substitution of a 4-hydroxystyrene unit, the substituent effect may be somewhat stronger in the para-position. Such considerations are within the knowledge of one skilled in the art and/or can be determined by experimentation of one skilled in the art.

Second and Third Embodiments

In both the second and third embodiments, the inventive resins of the positive-working photoresist compositions are comprised of a comonomer as given above containing at least two hydroxyl groups on a given aromatic ring with the two hydroxyl groups being attached to adjacent carbon atoms (i.e., the two hydroxyl groups are substituted in a 1,2-manner and are said to be present in a vicinal relationship with respect to each other).

Some illustrative examples of comonomer repeat unit B for the inventive sins according to embodiment 2 are given below:

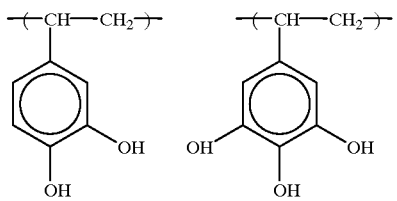

Some illustrative examples of comonomer repeat unit C for the inventive resins according to embodiment 3 are given below.

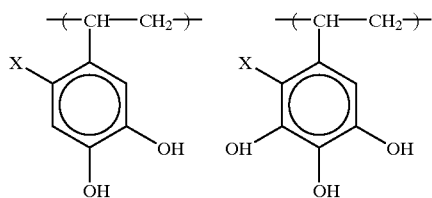

Fourth Embodiment

The inhibitability of a novolak resin can be increased by substituting its phenolic moieties with electron withdrawing substituents as shown in the structures below, where X is an electron withdrawing group and wherein X has the specifications given supra:

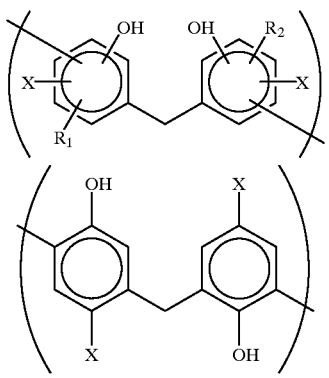

Broadly, the substituent X can be any substituent having a positive Hammett Substituent Constant $\geq 0.45$, except that $NO_2$ and $SO_3H$ are excluded. Suitable substituents X include, but are not limited to, $C_1$–$C_6$ perfluoroalkyl (including $CF_3$); $C_1$–$C_6$-trialkylammonium, where each alkyl is independently $C_1$–$C_6$; cyano (CN), methyl sulfonyl ($SO_2CH_3$), and trifluoromethyl sulfonyl ($SO_2CF_3$). In the inventive resins, the substituent X can be located on a given aromatic ring with respect to the OH group in an ortho, a meta, or a para position. The structure having the substituent X in the para position is preferred. Preferred substituents X include, but are not limited to, CN, $CF_3$, $SO_2CH_3$, and $SO_2CF_3$. $R_1$ and $R_2$ are independently $C_1$–$C_6$ alkyl.

Reducing Density of Percolation Sites and Increasing Inhibitability

The structures described above will have increased acidity of the phenolic OH groups and might, at the same time, increase the dissolution rate of the resin. To counteract this effect, a necessary and integral step in the design of the inventive resins is lowering the density (concentration) of hydrophilic percolation sites in the resin. This has also the important advantage of substantially increasing the inhibitability of the resin. This lowering of the density of percolation sites can be done in a variety of ways as summarized below.

a) In the fully substituted poly(hydroxystyrene), the concentration of hydrophilic percolation sites can be changed by alkylating a fraction of the phenolic hydroxyls. Other protecting groups than methyl can be used. The extent of alkylation may vary in wide limits (from 5 to 95 %, or more).

b) An alternative way of lowering the concentration of acidic OH-groups is to carry out the substitution only in part—i.e., substituting only a fraction of the phenolic groups of the resin. (This has the advantage that the resulting material contains a much lower concentration of substituent groups, and its absorption characteristics will not change as much as in case a).

c) Another possibility is copolymerizing a suitably substituted hydroxystyrene with an aromatic co-monomer that is neither substituted nor does it contain OH groups, e.g. styrene. Thus, for example, the copolymer of (hydroxy, cyano)-styrene with styrene will produce a material that contains only a small concentration of cyano groups as well as a low concentration of hydrophilic OH sites. The optical properties of this product will be better (i.e., higher transparency in the deep UV) than those of b) because the bulk of the material will be polystyrene, and not poly (hydroxystyrene).

d) If the material is to be highly transparent at shorter wavelengths, (e.g., 248 run) it is possible to copolymerize a substituted hydroxystyrene comonomer with an aliphatic comonomer. Such copolymerization affords a substantially aliphatic material. If stability to plasma exposure is desired, an aliphatic comonomer of choice is one that is a polycyclic aliphatic monomer, such as, for example, various monomers containing norbornyl, isobornyl, or adamantanyl groups etc.

Some key advantages of the PHOST (poly (hydroxystyrene)) copolymers of this invention over novolak are the following. The PHOST polymers have or afford the following:

1. Greater flexibility in the choice of comonomers for the copolymers.
2. The materials can be produced in a highly pure state.
3. Better molecular weight control using PHOST.

Comonomer E

A given photoresist composition of this invention can further comprise a comonomer unit E selected from the group consisting of styrene, hydroxystyrene, an acrylic comonomer, a methacrylic comonomer, an aliphatic monocyclic comonomer, and an aliphatic polycyclic comonomer.

Chemical Amplification

Photoresist compositions of this invention can be made to be chemically amplified (CA) dissolution inhibition resists by using resins that contain as a comonomer, a comonomer F which is comprised of ester linkages bearing protected acid groups that are cleavable by acid from the PAG to afford free acid in the resin (which imparts developability to the resin). Some suitable ester linkages with protecting groups include, but are not limited to, tertiary-alkyl esters, such as tertiary-butyl esters, and carbonates having at least one tertiary-alkyl group. Other protecting groups having sensitivity to acid produced by a PAG can be employed. Suitable protecting groups are known to those skilled in this art. Suitable protecting groups are discussed in many references (e.g., for example, "Protecting Groups for 193 nm Photoresists", by R. D. Allen et al., SPIE Proceedings, Vol. 2724, 1996, pages 334–343).

Photoactive Component

In a given composition of this invention, there is present, (as component (b)), at least one photoactive component capable of making the photoresist composition be positive-working. The invention broadly includes any component(s) that satisfy this requirement. In preferred embodiments for dissolution inhibition resists, the photoactive component also serves as a dissolution inhibitor while present in its initial state within the composition (prior to undergoing a photochemical change that affords the photoimaging capability).

Representative photoactive components that are suitable in this invention include, but are not limited to, diazonaphthoquinone (DNQ) and Diaza-4-hydroxy-coumarin (DC).

Illustrative preferred DNQ and DC compounds for this invention have the structures given below:

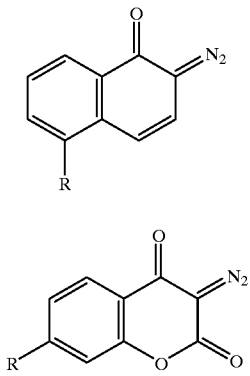

where R can be, but is not limited to, a sulfonic acid aromatic ester or an aromatic

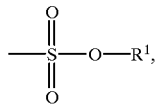

The invention is not limited to use of DNQ and DC compounds having the substitution as illustrated above. In general, DNQ and DC compounds can be employed that range with respect to substitution from being unsubstituted to be fully substituted at all positions of the aromatic Ting and the ethylenic moiety (of DNQ and DC).

The use of DNQ and DC compounds as photoactive components in dissolution inhibition resist formulations is known. DNQ is described in, for example, *Photoreactive Polymers, The Science and Technology of Resists*, by Amost Reiser, Wiley-Interscience, John Wiley & Sons, New York (1989), which is incorporated by reference. DC is described in "Tailoring of a Photoactive Compound for Non-Chemically Amplified 248 nm Resist Formulations", M. J. Leeson, A. Pawloski, V. Levering, W. Yueh, and C. G. Willson, SPIE Vol. 3049, pages 861–869, which is incorporated by reference.

Optional Compounds

Other compounds conventionally added to photopolymer compositions can also be present to modify the physical properties of the resists of this invention for a particular use. Such components can include, but are not limited to, other polymeric binders, fillers, thermal stabilizers, optical brighteners, adhesion modifiers, coating aids, release agents, and residue reducers.

GLOSSARY

AIBN 2,2'-azobisisobutyronitrile (=2,2'-azobis[2-methylpropionitrile]).
DC Diazo-4-hydroxycoumarin
DNQ Diazonaphthoquinone
Novolak Condensation polymer of a phenolic compound with formaldehyde or another aldehyde. The Novalak resin was obtained from 30 Hoechst-Celanese Corp., Corpus Christi, Tex. It had a weight average molecular weight of approximately 4000.
PHOST Poly(hydroxystyrene). An equivalent name is poly (vinyl phenol) or PVP. In a PHOST polymer, the hydroxy group can be ortho, meta, or para with respect to the backbone. Unless indicated otherwise, the hydroxy group is para to the backbone of the polymer.

POLYMERS

Polymer E Poly(2-nitro-5-acetoxy-styrene)
Polymer F Poly(2-nitro-5-hydroxy-styrene)
Polymer G Poly(3-nitro-4-hydroxy-styrene)* having 20% of the phenolic moieties nitrated
Polymer H Poly(3-nitro-4-hydroxy-styrene)* having 5% of the phenolic moieties nitrated
Polymer I Poly(3-nitro4hydroxy-styrene)* having 10% of the phenolic moieties nitated
Polymer J Poly(3-nitro-4-hydroxy-styrene)* having 80% of the phenolic moieties nitrated
Polymer K Poly(3-nitro-4-hydroxy-styrene)* having >95% of the phenolic moieties nitrated
Polymer L Poly(2-amino-5-hydroxy-styrene)
Polymer M Poly(2-diazonium chloride-5-hydroxy-styrene)
Polymer N Poly(2-cyano-5-hydroxy-styrene)
Polymer O Poly(3,4-diacetoxy-styrene)
Polymer P Poly(3,4-dihydroxy-styrene)
Polymer Q Poly(3,5-diacetoxy-styrene)
Polymer R Poly(3,5-dihydroxy-styrene)
*Polymer may contain small amounts (<5%) of the nitro substituent substituted in the 2-position of the phenolic moieties.
PVP Poly(vinyl phenol). In a PVP polymer, the hydroxy group can be ortho, meta, or para with respect to the backbone. Unless otherwise indicated, the OH group is substituted in the 4-position of the aromatic ring and is para to the backbone of the polymer (or to the vinyl group in the monomer precursor). An alternate name is poly (hydroxystyrene). Unless otherwise indicated, PVP is poly(4-hydroxystyrene). The PVP used in the examples herein was obtained from Hoechst Celanese Corp., Corpus Christi, Tex. and had a weight average molecular weight of 15,000.

EXAMPLES

Example 1

The synthesis of poly(2-nitro-5-hydroxy-styrene) is given in this example. Hydroxy group protection:

20 grams 2-nitro-5-hydroxy-benzaldehyde was dissolved in 100 ml acetic anhydride, and the resulting solution was refluxed for 3 hours under nitrogen. The solution was cooled down to room temperature and acetic anhydride was removed. There was obtained 2-nitro-5-acetoxy-benzaldehyde (Compound A) as a light-yellow solid (yield 92%).

Wittig Reaction:

A Wittig reaction was carried out using the following sequence of steps:

1) 0.015M Methylsulfinyl carbanion solution was made under nitrogen by adding 0.015 mol NaH to 25 ml $Me_2SO$ and stirring for half an hour until the evolution of hydrogen ceased;
2) Methyltriphenylphosphonium iodide was prepared by adding at room temperature 0.015 mol $Ph_3P$ to 40 ml $Me_2SO$ under nitrogen and stirring for half an hour, then 0.016 mol MeI was dropped into the resulting solution during half an hour, the resulting mixture was stirred for one hour at room temperature and then stirred for another hour at 50° C.; and cooled down to room temperature to afford a solution;
3) The solution 2) was dropped into the solution 1) over half an hour. The resulting solution was then stirred for another half hour at room temperature;
4) At room temperature, 1.045 g (0.005 mol) of Compound A in 15 ml $Me_2SO$ was added in one portion and the resulting solution was stirred for one hour at room temperature and another hour at 55° C.;
5) The solution was cooled down, 200 ml cool water were poured in and a white precipitate was formed. The solution was stirred for one hour;
6) The precipitate was filtered off and the clear solution was extracted three times with ether. The ether phase was washed twice with water and dried by magnesium sulfate;
7) The solvent was removed and 0.88 gram of 2-nitro-5-acetoxy-styrene (Compound C) was obtained (yield 85%).

Polymerization:

2 grams (0.01 mole) of monomer (Compound C) and 20 mg of AIBN (2,2'-azobisisobutyronitrile=2,2-azobis[2-methylpropionitrile])) were dissolved in 15 ml THF. Under nitrogen, the resulting solution was stirred for 8 hours at 60° C. The solution was cooled down to room temperature and slowly poured into 300 ml isopropanol to precipitate polymer. The resulting polymer E (poly(2-nitro-5-acetoxy-styrene)) upon drying weighted 1.2 grams.

Deprotection of Hydroxy Group:

1 gram of polymer E was dissolved in 50 ml methanolic solution of hydrochloric acid (1N), and the resulting solution was refluxed for 2 hours. Then the solution was cooled down to room temperature, and slowly poured into 500 ml water to precipitate polymer. The resulting polymer F (poly(2-nitro-5-hydroxystyrene)) upon drying weighted 0.65 grams.

Example 2

The preparation of poly(3-nitro-4-hydroxy-styrene) having 20% of the phenolic moieties nitrated is given in this example. This polymer is Polymer G.

5 grams of poly(p-vinyl-phenol) (PVP) was dissolved in 20 ml of acetone containing 3 drops of concentrated sulfuric acid (as catalyst), and the solution was cooled using an ice-water bath. Slowly 0.75 gram of concentrated nitric acid was dropped into the stirred reaction mixture. Then the resulting solution was stirred at ambient temperature for one hour. At the end of the one hour reaction period, the reaction mixture (solution) was added to 500 ml of cool water to precipitate polymer. The polymer was collected by filtration and dried to afford 4.1 g of Polymer G, which was characterized to be a nitrated PVP polymer having 20% of the phenolic moieties nitrated (mainly in the 3-position which is ortho to the 4-OH group).

Example 3

The preparation of poly(3-nitro-4-hydroxy-styrene) having 5% of the phenolic moieties nitrated is given in this example. The preparation was the same as in Example 2 except that the amount of concentrated nitric acid employed was 0.187 gram. The resulting nitrated polymer obtained upon drying weighed 4.3 grams and is designated as Polymer H.

Example 4

The preparation of poly(3-nitro-4-hydroxy-styrene) having 10% of the phenolic moieties nitrated is given in this example. The preparation was the same as in Example 2 except that the amount of concentrated nitric acid employed was 0.375 gram. The resulting nitrated polymer obtained upon drying weighed 4.1 grams and is designated as Polymer I.

Example 5

The preparation of poly(3-nitro-4-hydroxy-styrene) having 80% of the phenolic moieties nitrated is given in this example. The preparation was the same as in Example 2 except that the amount of concentrated nitric acid employed was 3.0 grams. The resulting nitrated polymer obtained upon drying weighed 4.1 grams and is designated as Polymer J.

Example 6

The preparation of poly(3-nitro-4-hydroxy-styrene) having essentially 100% (i.e., >95%) of the phenolic moieties nitrated is given in this example. The preparation was the same as in Example 2 except that the amount of concentrated nitric acid employed was 3.75 grams. The resulting nitrated polymer obtained upon drying weighed 4.2 grams and is designated as Polymer K.

Example 7

This example gives the procedure that was employed to prepare a series of test compositions and make measurements using them to obtain a measure of the inhibitability of a given test resin (polymer).

All test compositions were of the dissolution inhibition type and were formulated in the following manner. A given test resin solution (containing 25 weight % resin) was made by dissolving the resin in isobutyl acetate at ambient temperature. An inhibitor, 1,2-diazonaphthoquinone-5-sulfonic acid phenylester (molecular weight=316 Daltons), was added in the concentration indicated (expressed in mole % or weight %) for a given sample. The test composition was applied to a silicon wafer by spin coating. A standard laboratory spin coater was used at a spin rate of 3000 revolutions per minute. The coating operation was conducted at ambient temperature. Upon coating at ambient temperature, the test composition was finally dried at 90° C. for one hour.

For a given test resin, typically at least 3–4 different test samples were made having different inhibitor concentrations (($C_i$), mole % or weight %, as labeled), which varied over the range 0–6 mole % or 0–10 weight %.

To test the compositions for a given resin, films were dissolved in 0.2 M aqueous KOH solution at 20° C. The dissolution rate of a given sample was measured with a laser interferometer. The time difference between two successive peaks of the reflection intensity curve was measured and from it the dissolution rate determined as described e.g. in Thompson, Willson and Bowden, "Introduction to Microlithography", Second Edition, American Chemical Society Professional Reference Book, American Chemical Society, Washington, D.C., 1994, p. 280 and following.

Next the logarithm of the dissolution rate of the given film sample was plotted as a function of the inhibitor content. Approximately linear plots were obtained having negative slopes. The absolute value of the negative slope of this plot was taken as a measure of inhibitability, which is designated as the inhibition factor f. The greater the magnitude of the inhibition factor f for a given resin, the greater is the inhibitability of that resin when used in a dissolution inhibition resist composition.

Example 8

In this example, film compositions were made and tested using the procedure of Example 7 for four different resin samples. The first resin tested is poly(vinyl phenol) (PVP); test compositions made with this resin are designated as "original". The second resin tested is Polymer K (Example 6), which has essentially 100% nitration (>95%) in the ortho position to the hydroxyl group; test compositions made with this resin are designated as "ortho". The third resin that was tested is Polymer F (Example 1), which has one nitro group and one hydroxyl group on each aromatic ring of the polymer in a para relationship; test compositions made with this resin are designated as "para". The fourth resin that was tested is Polymer G (Example 2), which has 20% of the phenolic moieties nitrated predominantly in the position ortho to the hydroxyl; test compositions made with this resin are designated as "20% Nitration". PVP used in these examples was obtained from Hoechst Celanese Technical Center, Corpus Christi, Tex., USA. The weight average molecular weight of the resin was 15,000.

Plots were made of logarithm of the dissolution rate versus the concentration ($C_i$) of the dissolution inhibitor (photoactive component) as described in Example 7. FIG. 1 illustrates the essentially linear plots that were obtained for these four resins. The measured inhibition factor f for each resin is also shown in FIG. 1.

Test compositions made with PYP (without substitution of an electron-withdrawing group) exhibited a low degree of inhibitability—the measured inhibition factor was 1.9.

Test compositions made with Polymer K (Example 6), which resin has >95% nitration ortho to the hydroxyl moiety in each aromatic unit, also exhibited a low degree of inhibitability—the measured inhibition factor was 1.6.

Test compositions made with Polymer F (Example 1), which resin has 100% nitration para to the hydroxyl moiety in each aromatic unit, exhibited a high degree of inhibitability—the measured inhibition factor was 6.7.

Test compositions made with Polymer G (Example 2), which resin has 20% nitration ortho to the hydroxyl moiety in each aromatic unit, also exhibited a high degree of inhibitability—the measured inhibition factor was 6.6.

Example 9

This example illustrates how markedly the inhibition factor f for a resin bearing electron-withdrawing nitro ($-NO_2$) substituents on some of the phenolic moieties depends upon the percentage P of the phenolic groups in the resin that are nitrated The resins tested in this example are nitrated PVP polymers that were nitrated to varying degrees. Specifically, the resins are poly(3-nitro-4-hydroxystyrene) samples having varying degrees of nitration of the phenolic moieties in the PVP: 1) Polymer H (Example 3) having 5% nitration; 2) Polymer I (Example 4) having 10% nitration; 3) Polymer G (Example 2) having 20% nitration; and 4) Polymer J (Example 5) having 80% nitration.

The test samples of dissolution inhibition resists for this example were prepared in the same manner as given in Example 7.

Figure 2:
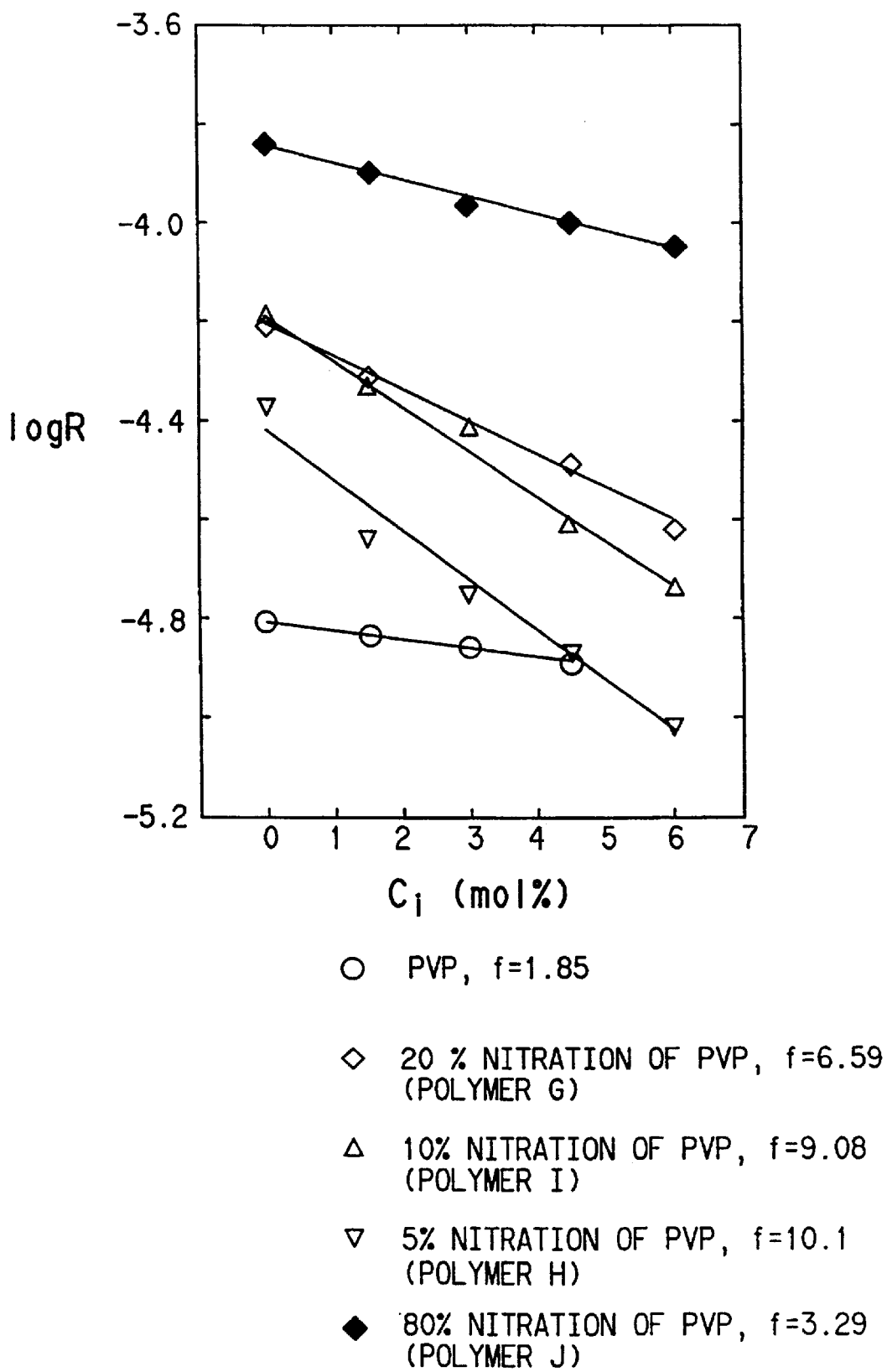
FIG. 2 is a plot of the logarithm of the dissolution rate (logR) versus the concentration ($C_i$) of the dissolution inhibitor for five different resins. The plots are essentially linear and the absolute value of the negative slope of a given plot is the inhibition factor f for a given resin when present in a series of dissolution inhibition resist test compositions. The five different resins whose test composition plots are in FIG. 2 are PVP, Polymer G. Polymer I, Polymer H, and Polymer J.
Figure 3:
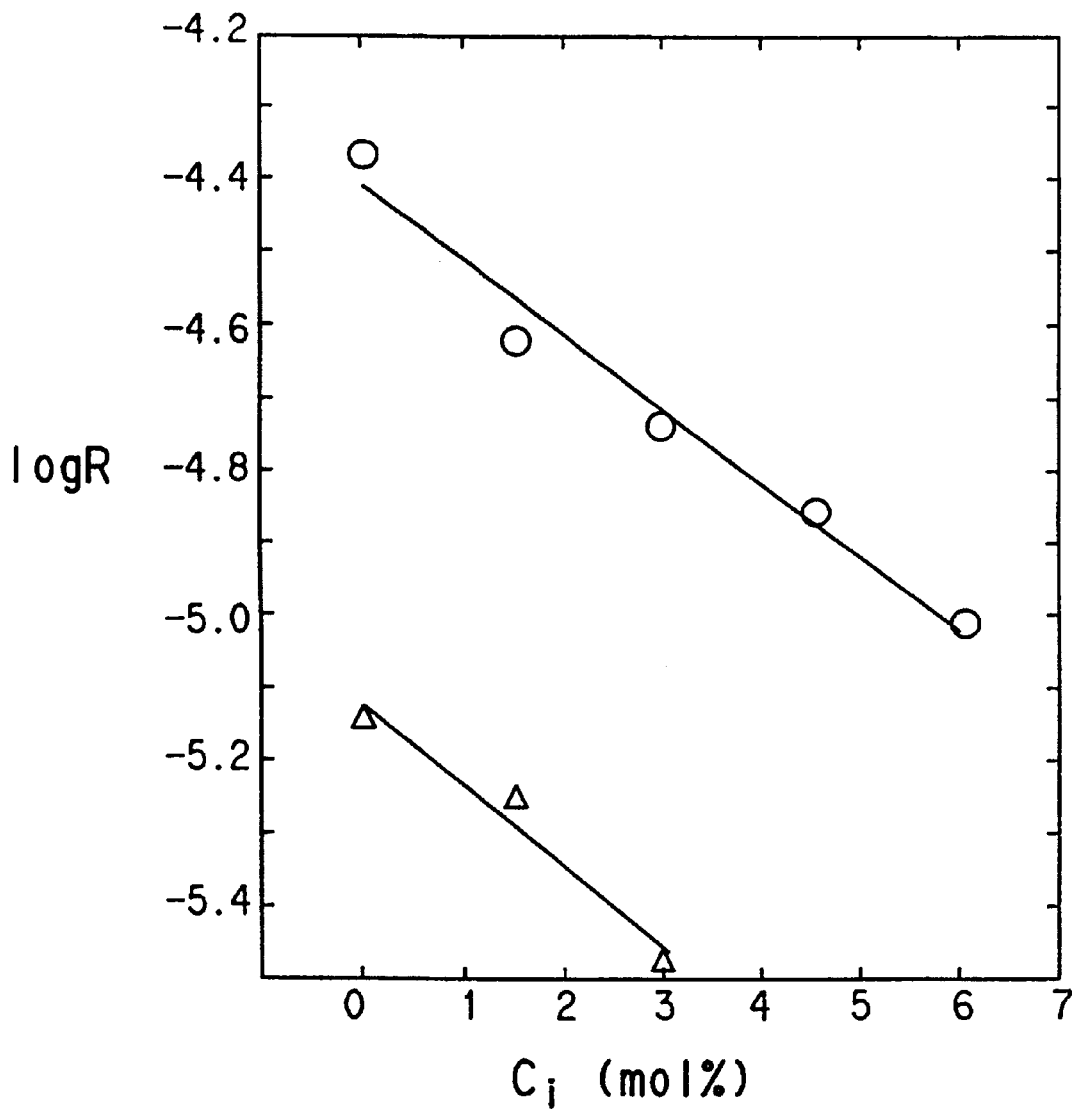
FIG. 3 is a plot of the logarithm of the dissolution rate (logR) versus the concentration ($C_i$) of the dissolution inhibitor for two different resins. The plots are essentially linear and the absolute value of the negative slope of a given plot is the inhibition factor f for a given resin when present in a series of dissolution inhibition resist test compositions. The two different resins whose test composition plots are in FIG. 3 are Novolak and Polymer H (PVP nitrated to 5% level).

FIG. 2 illustrates the significant and marked dependence of the inhibition factor f for a given resin upon the percentage of the aromatic groups that are nitrated. At the lowest level of nitration (sample containing Polymer H with 5% nitration), the inhibition factor was measured to be 10.1. Upon increasing the % of nitration to 10% (in the sample containing Polymer I), the measured inhibition factor was 9.08. Upon further increasing the percentage of nitration to 20% (Polymer G), the measured inhibition factor is 6.59. In case of the fourth sample having 80% nitration of PVP (Polymer J), the test samples containing this polymer exhibited an inhibition factor f of 3.29. These results are illustrated graphically in FIG. 2 along with a control polymer of PVP—test samples of PVP (having no electron-withdrawing substituent), afforded a measured inhibition factor f of 1.85. One other measured inhibition factor is relevant—that for >95% nitrated PVP, which is Polymer K and is designated "ortho" in FIG. 1. Test samples with this resin exhibited a measured inhibition factor f that was 1.6 (very low).

This example thus illustrates that there is a dramatic difference in measured inhibition factor f for a resin bearing a given substituent depending upon the extent of substitution of the active, electron-withdrawing group (nitro group in this example). The measured inhibition factor varies from as high as 10.1 at 5% nitration of PVP to as low as 1.6 at >95% nitration of PVP. Thus these results demonstrate that the inhibitability of a given resin type (e.g., nitrated PVPs) can be dramatically altered and increased by diluting the polymer with comonomers that do not bear an electron-withdrawing group. In the present example, the comonomer present that "dilutes" the active nitro group is vinyl phenol.

Example 10A

A copolymer is prepared by free radical polymerization using the method given in Example 1. A mixture of two monomers is used in the polymerization. The first one is 2-nitro-5-hydroxystyrene which is present to the extent of 20 mole %; the second one is 4-hydroxystyrene, which is present to the extent of 80 mole %. Analysis of the copolymer is done to confirm that approximately 20% of the phenolic groups contain a nitro substituent. A series of dissolution inhibition resist test compositions as described in Example 7 is made using this copolymer. A plot is made of the log of the dissolution rate versus the mole % concentration of the dissolution inhibitor (which is DNQ). The plot is essentially linear and has a negative slope which indicates that the inhibition factor f for this set of test compositions with this copolymer resin is 9.0, indicating the copolymer resin has a high degree of inhibitability.

Example 10B

A copolymer is prepared in the same manner as given in Example 10A except that 2-nitro-5-hydroxystyrene is present to the extent of 10 mole % and 4-hydroxystyrene is present to the extent of 90 mole %. Testing of the copolymer as a dissolution inhibition resist is done in the same manner as in Example 10A. The set of test compositions containing this copolymer are determined to be highly inhibitable—the inhibition factor f that is measured is 12.0.

Example 10C

A copolymer is prepared in the same manner as given in Example 10A except that styrene is used as the second comonomer in place of 4-hydroxystyrene. The styrene is present to the extent of 80 mole %. Testing of the copolymer as a dissolution inhibition resist is done in the same manner as in Example 10A. The set of test compositions containing this copolymer are determined to be highly inhibitable—the inhibition factor f that is measured is 9.1.

Example 10D

In this example, 90% of the phenolic moieties present in poly(2-nitro-5-hydroxystyrene) are methylated, such that only 10% remain as acidic phenolic moieties in the resulting copolymer. The synthesis of the copolymer is as follows: Poly(2-nitro-5-hydroxystyrene) homopolymer (0.5 g), (carrying 0.003 mol hydroxyl groups) and 0.113 g of NaOH are dissolved in 10 ml of water. The solution is stirred at 10° C. while 0.253 ml (0.0027 mol) of dimethylsulfate are dropwise added to the solution. The solution is then stirred at 70° C. for half an hour, and then cooled to ambient temperature. It is then slowly dropped into 200 ml of cold water, resulting in the polymer precipitating. The polymer is filtered, dried, and weighed (0.46 g). It is then redissolved in a small amount of acetone and reprecipitated into 200 ml of water. It is then filtered off and dried. Analysis is done to establish that only approximately 10% of the aromatic rings in the polymer bear free hydroxyl (OH) groups.

Testing of the copolymer as a dissolution inhibition resist is done in the same manner as in Example 10A. The set of test compositions containing this copolymer are determined to be highly inhibitable—the inhibition factor f that is measured is 11.9.

Example 11

This example gives the procedure for the synthesis of poly(2-cyano-5-hydroxy-sytrene), which is Polymer N.

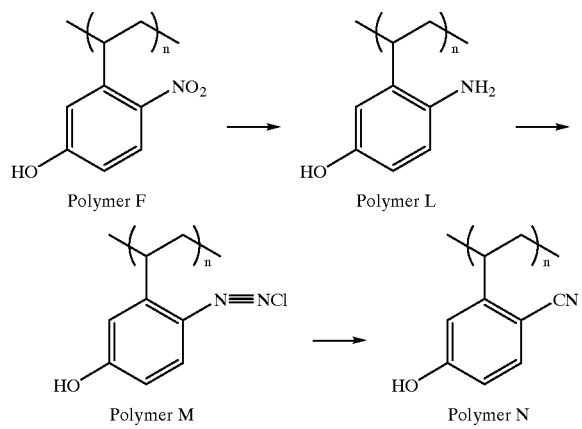

5 gram of Polymer F (with 0.03 mol nitro group) is dissolved in 35 ml of acetone and 5 ml of water, 5.4 gram (0.046 mol) of granulated tin is added in. The above solution is kept cool in a cool-water bath. 12 ml of concentrated hydrochloric acid is dropped in slowly with vigorous stirring. Solution is refluxed for one hour and then cooled to room temperature. The solution is neutralized with dilute sodium hydroxide (0.01 N), and then dropped into 500 ml of cool water, when Polymer L is precipitated. The product is filtered and dried for the following step.

5 gram (0.037 mol) of Polymer L is dissolved in a solution of 3.7 ml of concentrated hydrochloric acid in 30 ml acetone and 5 ml water. With vigorous stirring, the solution is cooled to 0° C. and maintained at that temperature during the addition in turn of 9.25 ml of concentrated hydrochloric acid and a solution of 2.7 gram of sodium nitrite in 10 ml of water. After addition, the solution is stirred for another half hour, and then a small quantity of urea is added to destroy the excess of nitrous acid. This diazonium salt solution is kept at ice temperature while the cyanide solution is being prepared.

0.045 mol copper (I) cyanide is dissolved in a solution of 5.83 gram of potassium cyanide in 15 ml of water. The copper (I) cyanide solution is warmed at 60° C. and the cold diazonium salt solution is added in small quantities at a time, stirring vigorously and keeping the temperature at 60–70° C. After the addition, the solution is heated to 100° C. for around 20 minutes in order to complete the reaction. The solution is cooled to room temperature and dropped into 700 ml of cool water. The Polymer N precipitates, it is filtered and dried.

To test the inhibitability of the Polymer N, a 25% wt solution of it in isoamyl acetate (as a suitable solvent) is made. To this 5% of a standard diazonaphthoquinone PAC (inhibitor) are added. From this coating solution, a film is cast as described. The film is dried for one hour at 90° C. Its dissolution rate in aqueous case is then determined with a laser interferometer or in a DRM (dissolution rate monitor). This inhibitability is measured in terms of the inhibition factor. With the inhibition factor of poly(2-nitro-5-hydroxystyrene) being f=6.1 in this conditions, the inhibition factor of the homopolymer poly(2-cyano-5-hydroxy-styrene) if 4.9. The inhibition factor of a copolymer containing 20% (mol) of 2-cyano-5-hydroxy styrene monomer is f=10.

Example 12

Figure 4:
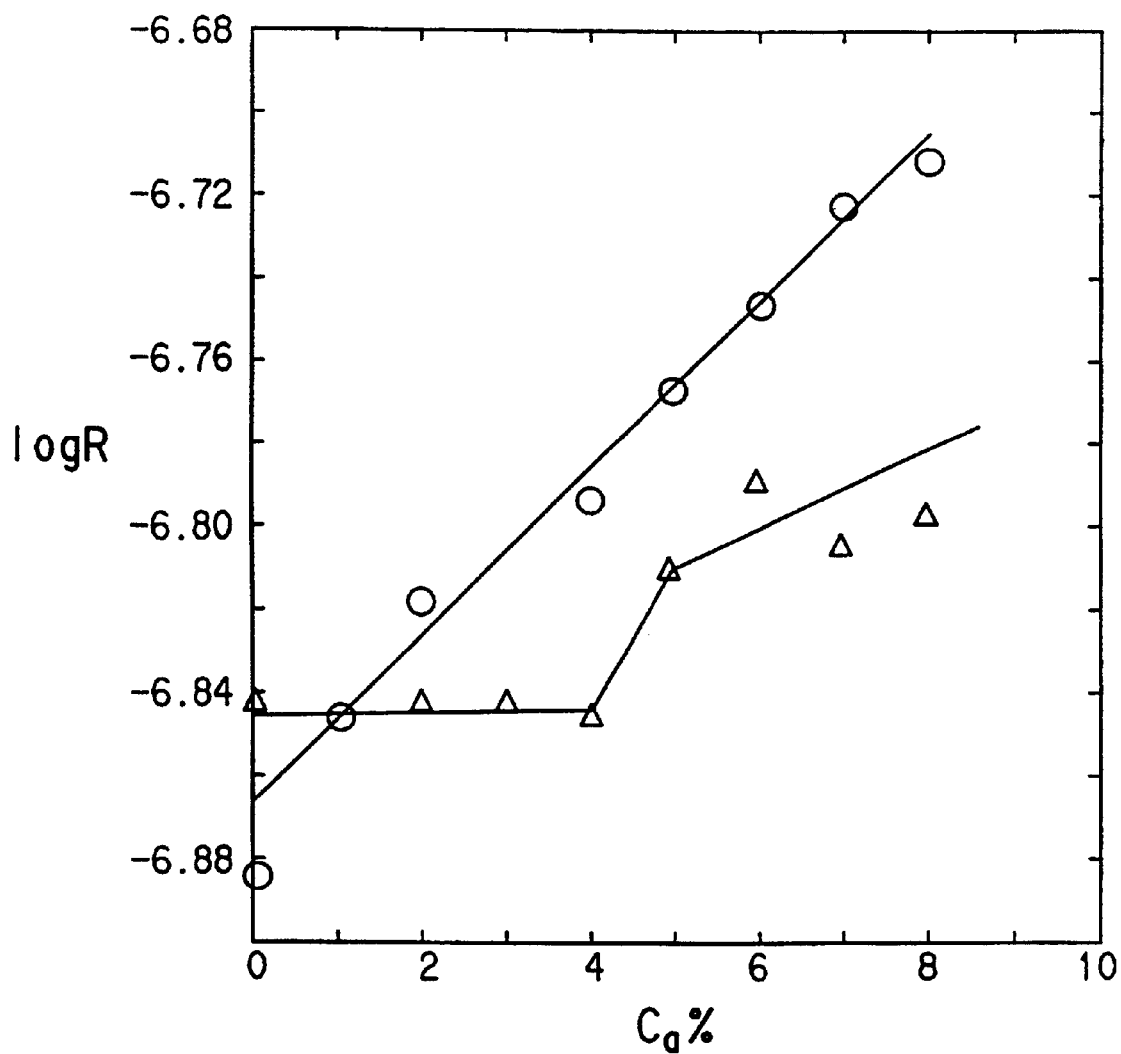
FIG. 4 is a plot illustrating dramatic differences on dissolution acceleration between two different dihydroxy compounds in a novolak based dissolution inhibition resist formulation.

This example illustrates a dramatic difference between two isomeric dihydroxy compounds (non-polymeric) both of which a priori one skilled in the art would expect to act as dissolution accelerators in a dissolution inhibition resist composition. The resist composition of this example was a novolak resin containing 3% of the standard DNQ inhibitor (see Example 1). Compositions containing 3,4-dihydroxy-toluene (containing vicinal OH groups) and 3,5-dihydroxy-toluene (containing non-vicinal OH groups) were prepared and tested in the manner outlined in Example 7. The results are summarized in FIG. 4. The 3,5-dihydroxy-toluene, not having vicinal OH groups, acted as anticipated as a typical dissolution accelerator. As shown in FIG. 4, the logarithm of the dissolution rate (logR) increased steadily in this case with increasing concentration ($C_a$—weight %) of the 3,5-dihydroxy-toluene. In sharp contrast, the 3,4-dihydroxy-toluene, having vicinal OH groups, unexpectedly did not act as a typical dissolution accelerator. As shown in FIG. 4 for this latter case, the logarithm of the dissolution rate (logR) remained essentially constant up to a concentration of 4% of the vicinal dihydroxy compound (3,4-dihydroxy-toluene), which indicates that over the $C_a$ range of 0–4 weight %, it is not acting as a dissolution accelerator. At $C_a$ levels above 4%, the vicinal diol thence commenced acting as a dissolution accelerator (where logR then increases with increasing $C_a$ concentration above 4%). These results for model non-polymeric compounds are indicative of the inhibitability of the corresponding polymeric compounds for the reasons presented below.

The behavior of 3,4-dihydroxytoluene indicates that this molecule is being incorporated into phenolic strings produced by the inhibitor (diazonaphthoquinone sulfonic acid phenylester) in the coating solution of novolak. This is the reason why this dihydroxy compound does not accelerate the dissolution of the inhibited novolak. Being incorporated into the phenolic strings formed by the inhibitor also means that a polymer carrying 3,4-dihydroxy phenyl units will readily form phenolic strings with this inhibitor and consequently will be highly inhibitable. In contradistinction, 3,5-dihydroxytoluene does accelerate the dissolution of novolak which shows that is acts as a monomeric phenol in the coating solution and is not incorporated into the phenolic strings of the inhibitor. It is therefore unlikely that a polymer carrying this motif will be able to form phenolic strings with the inhibitor. As a result, it will not be readily inhibited.

Example 13

This example gives the procedure for the synthesis of poly(3,4-dihydroxy- styrene), which is Polymer P.

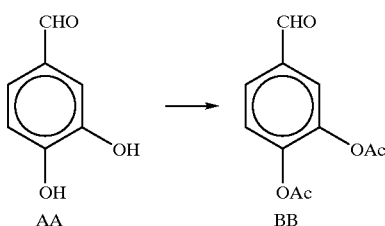

5 gram of 3,4-dihydroxybenzaldehyde is dissolved in 50 ml of acetic anhydride. The solution is protected by nitrogen atmosphere and refluxed for two hours. Acetic anhydride is then removed and the product obtained. It is washed with water until neutrality and dried.

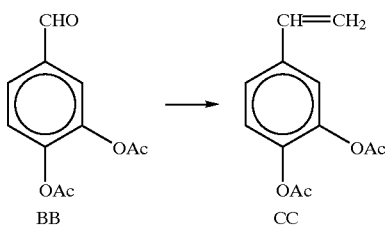

1) Metylsulfonyl carbanion solution Under the protection of nitrogen, 0.015 mol sodium hydroxide with 25 ml methyl sulfoxide is stirred at room temperature until the evolution of hydrogen ceased, or heated at 70° C. for 30 minutes;
2) Methyl triphenylphosphonium iodide 0.015 mol tripyhenylphosphine is dissolved in 40 ml methyl sulfoxide and 0.016 mol methyl iodide is dropped in at room temperature. The above solution is stirred for one hour, and then stirred for another hour at 50° C., cooled to room temperature;
3) At room temperature, methyltriphenylphosphinium iodide solution is dropped into methylsulfonyl carbanion solution, the continued to stir for half an hour.

0.015 mol of compound BB solution in 15 ml of methyl sulfoxide is added in one portion at room temperature, and the solution is stirred for one hour, and another hour at 55° C. The reaction vessel is cooled to room temperature and 100 ml cool water are poured in. The mixture (solid and liquid) is shaken with 300 ml pentane, it is decanted, combined and washed once with water, dried over anhydrous sodium sulfate, evaporated to a volume of 50 ml, and filtered through 20 gram of neutral alumina, using 500 ml of pentane to elute the product. Pentane is removed to give the produce CC.

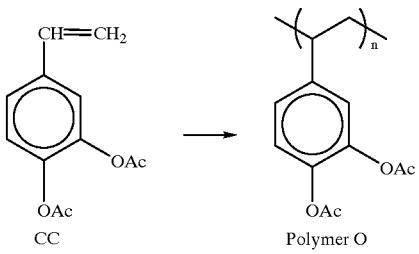

2 grams monomer (CC) and 20 mg initiator (AIBN, 1%) are dissolved in 15 ml THF. Under nitrogen, the resulting solution is stirred for 8 hours at 60° C. The solution is cooled to room temperature and slowly poured into 300 ml isopropanol. The resulting Polymer 0 is precipitated; it is filtered off and dried.

1 gram of the Polymer 0 is dissolved in 50 ml methanolic solution of hydrochloric acid. (1N), and the resulting solution is refluxed for 3 hours. Then the solution is cooled down to room temperature, and slowly poured into 500 ml water. The Polymer P is precipitated and dried.

The Polymer P is tested for inhibitability as described before. Using the standard PAC (photoactive component) of the previous experiments, the inhibition factor of the homopolymer is found as f=5.5. The inhibition factor of a copolymer containing 20% of the 3,4-dihydroxy-styrene monomer is f=12.

Example 14

This example gives the procedure for the synthesis of poly(3,5-dihydroxystyrene), which is Polymer R.

5 grams of 3,5-dihydroxyberzaldehyde is dissolved in 50 ml acetic anhydride. The solution is refluxed under nitrogen for two hours, and then acetic anhydride is removed and the product obtained. It is washed with water to neutrality and then dried.

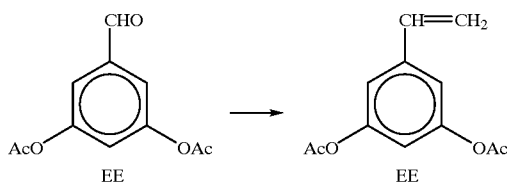

1) Methylsulfonyl carbanion solution Under the protection of nitrogen, 0.015 mol sodium hydride with 25 ml methyl sulfoxide is stirred at room temperature until the evolution of hydrogen ceases, or heated at 70° C. for 30 minutes.
2) Methyl triphenylphosphonium iodide 0.015 mol triphenylphosphine is dissolved in 40 ml methyl sulfoxide and 0.016 mol methyl iodide is dropped in at room temperature. The above solution is stirred for one hour, and then stirred for another hour at 50° C., cooled to room temperature;
3) At room temperature, methyltriphenylphosphonium iodide solution is dropped into methylsulfonyl carbanion solution then stirred for half an hour. 0.015 mol of compound B solution in 15 ml of methyl sulfoxide is added in one portion at room temperature, and the solution is stirred for one hour, and another hour at 55° C. The reaction is cooled down to room temperature, and 100 ml cool water is poured in. The mixture of solid and liquid is shaken with 300 ml of pentane. It is decanted, combined and washed once with water, dried over anhydrous sodium sulfate, evaporated to a volume of 50 ml, and filtered through 20 grams of neutral alumina, using 500 ml of pentane to elute the product. Pentane is removed to give the product C.

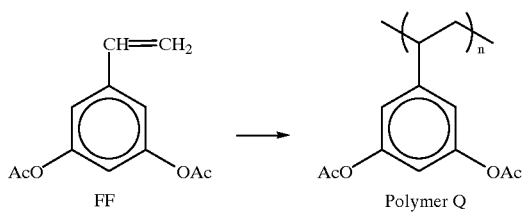

2 grams monomer (FF) and 20 mg initiator (AIBN, 1%) are dissolved in 15 ml THF. Under nitrogen, the resulting solution is stirred for 8 hours at 60° C. The solution is cooled down to room temperature and slowly poured into 300 ml isopropanol. The resulting Polymer Q is precipitated and dried.

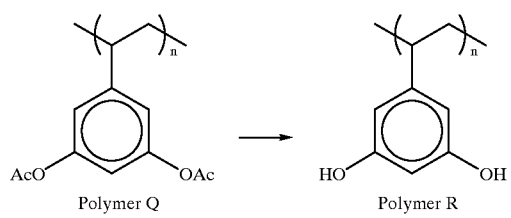

1 gram of the Polymer Q is dissolved in 50 ml methanolic solution of hydrochloric acid (1N), and the resulting solution is refluxed for 3 hours. Then the solution is cooled down to room temperature, and slowly poured into 500 ml water. The Polymer R is precipitated and dried.

The Polymer R is tested for inhibitability as described before. Using the standard diazonaphthoquinone inhibitor, the inhibition factor of the homopolymer is found as f=1.8. A copolymer containing 20% (mol) of the 3,5-dihydroxystyrene monomer has an inhibition factor of f=3.5.

What is claimed is:

1. A positive-working photoresist composition comprising:

(a) a polymer comprising a comonomer unit A having the structure:

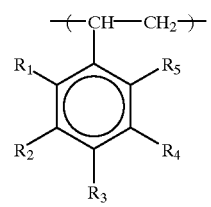

wherein $R_1$, $R_2$, $R_3$, $R_4$, and $R_5$ can be the same or different and are selected from the group consisting of H, OH, and X;

at least one of $R_1$, $R_2$, $R_3$, $R_4$, and $R_5$ being OH; and at least one of $R_1$, $R_2$, $R_3$, $R_4$, and $R_5$ being X; and X is selected from the group of substituents having a Hammett Substituent Constant in its position in relation to said at least one OH that is greater than or equal to 0.45, except that X is not nitro or $SO_3H$; and (b) at least one photoactive component capable of making the photoresist composition be positive-working said photoactive component being a dissolution inhibitor.

2. The composition of claim 1 wherein the X substituent is selected from the group consisting of cyano, trifluoromethyl, $C_1$–$C_6$-trialkylammonium, where each alkyl is independently $C_1$–$C_6$, $SO_2CH_3$ and $SO_2CF_3$.

3. The composition of claim 1 wherein the polymer further comprises a comonomer unit E selected from the group consisting of styrene, hydroxystyrene, an acrylic comonomer, a methacrylic comonomer, an aliphatic monocyclic comonomer, and an aliphatic polycyclic comonomer.

4. The composition of claim 1 wherein the polymer further comprises a comonomer F which is comprised of ester linkages that are cleavable by acid.

5. The composition of claim 1 wherein the photoactive component is selected from the group consisting of a diazonaphthoquinone and a diazocoumarin.

6. The composition of claim 1 further comprising a solvent.

7. The composition of claim 6 wherein the solvent is isobutyl acetate or isoamyl acetate.

8. A dissolution inhibition resist composition comprising:

(a) a polymer comprising a comonomer unit A having the structure:

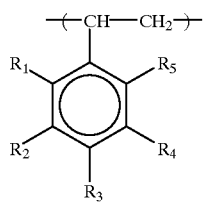

wherein $R_1$, $R_2$, $R_3$, $R_4$, and $R_5$ can be the same or different and are selected from the group consisting of H, OH, and X;

at least one of $R_1$, $R_2$, $R_3$, R4, and $R_5$ being OH; and
at least one of $R_1$, $R_2$, $R_3$, $R_4$, and $R_5$ being X; and X is selected from the group of substituents having a Hammett Substituent Constant in its position in relation to said at least one OH that is greater than or equal to 0.45, except that X is not nitro or $SO_3H$; and (b) at least one dissolution inhibitor.

* * * * *